United States Patent [19]

Chung et al.

[11] Patent Number: 5,986,474

[45] Date of Patent: Nov. 16, 1999

[54] DATA LINE BIAS CIRCUIT

[75] Inventors: Jinyong Chung, Los Altos Hills; Li-Chun Li, Los Gatos; Pochung Young, Fremont, all of Calif.

[73] Assignee: Mosel Vitelic, Inc., Taiwan

[21] Appl. No.: 08/585,994

[22] Filed: Jan. 12, 1996

[51] Int. Cl.[6] .............................................. H03K 19/0175
[52] U.S. Cl. ......................... 326/86; 365/203; 365/189.11
[58] Field of Search .................. 326/30, 86; 365/189.06, 365/189.09, 189.11, 203

[56] References Cited

U.S. PATENT DOCUMENTS 3,902,082  8/1975  Proebsting et al. ................. 365/189.11
4,467,449  8/1984  Hayashi .................................. 365/203

Primary Examiner—Edward P. Westin
Assistant Examiner—Richard Roseen
Attorney, Agent, or Firm—Townsend and Townsend and Crew LLP; Larry Mendenhall

[57] ABSTRACT

A circuit for generating a voltage for pre-charging a data line. The circuit receives as input an ON/OFF signal which is typically the data bus line equalization control signal. The circuit also receives a varying power voltage. The circuit includes a bleeder which biases the data line at a voltage differing from said varying power voltage by a constant amount when the circuit is ON. The circuit consumes substantially zero power when OFF.

14 Claims, 6 Drawing Sheets

DATA LINE BIAS CIRCUIT

BACKGROUND OF THE INVENTION

This invention relates to circuitry for biasing data bus lines in preparation for sensing data values on data lines. More particularly, this invention relates to methods and apparatus for maintaining a data bus line at a reference voltage even should the external power supply vary.

FIG. 1 is a bus schematic including a pre-charging circuit of the prior art. FIG. 1 shows data bus lines DB 30 and $\overline{\text{DB}}$ 31. To node 20 on data bus line DB 30 is connected the drain of NMOS transistor 17. To node 21 on data bus line $\overline{\text{DB}}$ 31 is coupled the drain of NMOS transistor 18. The sources of transistors 17 and 18 are each coupled to $V_{CC}$. FIG. 1 also shows NMOS transistors 10, 11 and 12, each of whose gate is coupled to signal DBEQ 1. The source of each of transistors 10 and 11 is coupled to $V_{CC}$. The drain of transistor 10 is coupled to the source of transistor 12 at node 20, while the drain of transistor 11 is coupled to the drain of transistor 12 at node 21. Both data bus lines DB 30 and $\overline{\text{DB}}$ 31 feed directly into a data bus sense amplifier DBSA 40 and indirectly into a number of bit line sense amplifiers via paired NMOS switches such as bit line sense amplifier BLSA 50 and NMOS transistors 14 and 13. DBSA 40 is a conventional sense amplifier whose exact composition is not important herein. BLSA 50 is typically a balanced-sensing sense amplifier as is known in the art. The control inputs of transistors 13 and 14 are both coupled to Y-select line 5.

In preparation for sensing the value of the data bus lines DB 30 and $\overline{\text{DB}}$ 31, control circuitry (not shown) will attempt to pre-charge data bus lines DB 30 and $\overline{\text{DB}}$ 31 and equalize them to $V_{CC}\text{-}V_{T_N}$. ($V_{CC}$ is the power supply; $V_{T_N}$ is the threshold voltage of an N-channel transistor.) Accordingly, the control circuitry raises signal DBEQ 1 to HIGH. As a result, transistors 10 and 11 are turned on, and data bus lines DB 30 and $\overline{\text{DB}}$ 31 are pre-charged through transistors 10 and 11. Transistor 12 helps to insure that the charges on the two lines are equal. The final potential of data bus lines DB 30 and $\overline{\text{DB}}$ 31 is $V_{CC}\text{-}V_{T_N}$.

Transistors 17 and 18 are weak pull-up transistors. Transistors 17 and 18 provide a weak but constant pull on data bus lines DB 30 and $\overline{\text{DB}}$ 31 to the potential $V_{CC}\text{-}V_{T_N}$. Transistors 10, 11 and 12 are significantly more powerful than transistors 17 and 18.

When Y-select 5 turns on after BLSA 50 completes its sensing action, data bus lines DB 30 and $\overline{\text{DB}}$ 31 begin to follow bit lines Bit 35 and Bit 36, respectively. If bit line Bit 35 is "1" and bit line Bit 36 is "0," then data bus DB 30 remains at $V_{CC}\text{-}V_{T_N}$, while BLSA 50 pulls data bus line $\overline{\text{DB}}$ 31 low through the Y-select switch 13. Without transistors 17 and 18, BLSA 50 would pull data bus line $\overline{\text{DB}}$ 31 all the way to ground level. If that occurs, pre-charging data bus line $\overline{\text{DB}}$ 31 for the next operation would take an increased amount of time and would thereby limit the operation speed of the device. To prevent this deep a drop on data bus line $\overline{\text{DB}}$ 31, a circuit designer adds transistor 18 which pulls up data bus line $\overline{\text{DB}}$ 31. Hence, data bus line DB cannot drop below a certain level predetermined by circuit design as understood in the art. Since data bus line $\overline{\text{DB}}$ 31 should provide a "0" to DBSA 40, transistor 18 cannot be strong. Otherwise, the signal difference between data bus lines DB 30 and $\overline{\text{DB}}$ 31 for sensing by DBSA 40 will be too small to insure correct operation.

Transistor 17 keeps data bus line DB 30 from dropping below $V_{CC}\text{-}V_{T_N}$ due to, say, leakage or coupling noise from neighboring signal lines (not shown).

Transistors 10, 11 and 12 are sufficiently strong to pull data bus line $\overline{\text{DB}}$ 31 to $V_{CC}\text{-}V_{T_N}$ for a short DBEQ signal.

When the source $V_{CC}$ is fixed, the operation of the above circuit is as expected. However, in circuits subject to power surges and power ebbs and in circuits where sudden large currents may be switched on and off, the source $V_{CC}$ is not fixed and can vary from a voltage $V_{CC_1}$ to a lower voltage $V_{CC_2}$. In such cases, with the pre-charger of FIG. 1, there is no circuitry to pull data bus lines DB 30 and $\overline{\text{DB}}$ 31 down to $V_{CC_2}\text{-}V_{T_N}$. N channel transistors coupled to $V_{CC}$ can only bring data bus lines DB 30 and $\overline{\text{DB}}$ 31 up to $V_{CC}\text{-}V_{T_N}$. In other words, N channel transistors can respond only to rising $V_{CC}$. In the case of falling $V_{CC}$, these transistors would be off, since the gate to source voltage ($V_{CC_2}\text{-}(V_{CC_1}\text{-}V_{T_N})$, here) would be lower than the threshold voltage $V_{T_N}$.

FIG. 4 is a timing chart illustrating the operation of the circuit of FIG. 1 in the presence of fluctuations in $V_{CC}$. In FIG. 4, $V_{CC}$ 400 and DBEQ 410 both begin at $V_{CC_1}$ and then fall to $V_{CC_2}$. The Y-select signal 420 goes high and DBEQ 410 falls shortly thereafter. The development of the signals 430 on the data bus lines DB 30 and $\overline{\text{DB}}$ 31 is crucial to the operation of the data bus sense amplifier DBSA 40.

When $V_{CC}$ is $V_{CC_2}$, one of data bus signals DB 30 and $\overline{\text{DB}}$ 31 should reach $V_{02}$ in order for DBSA 40 to operate correctly. However, since $V_{CC}$ is down to $V_{CC_2}$, the discharge of one of the signals 430 from $V_{CC_1}\text{-}V_{T_N}$ to $V_{02}$ takes longer than the ideal case where signals 430 are already at $V_{CC_2}\text{-}V_{T_N}$. (Where $V_{CC}$ rises, signals 430 follow the change, and the circuit of FIG. 1 operates correctly.)

To reduce a pre-charging circuit's sensitivity to fluctuating $V_{CC}$ sources, the prior art employs bleeding circuits or "bleeders." FIG. 2 is a schematic of one such prior art pre-charging circuit using a bleeder. FIG. 2 includes circuit 60 of FIG. 1, including pre-charging transistors 10, 11, 12, pull-up transistors 17 and 18, signal DBEQ 1 and data bus lines DB 30 and $\overline{\text{DB}}$ 31, coupled as described above. FIG. 2 also includes DBSA 40, BLSA 50 and Y-select transistors 13 and 14, coupled to each other and to circuit 60 as described above. FIG. 2 still further includes bleeder transistors 15 and 16, respectively coupled by their drains to data bus lines DB 30 and $\overline{\text{DB}}$ 31. The source of each of NMOS transistors 15 and 16 is tied to ground. The gates of transistors 15 and 16 are coupled to signal A 2.

Before attempting to sense data bus lines DB 30 and $\overline{\text{DB}}$ 31, under the condition that $V_{CC}$ is lowered from $V_{CC_1}$ to $V_{CC_2}$, the bus control circuitry (again not shown) asserts signal A. Transistors 15 and 16 are turned on and bleed charge off the data bus lines DB 30 and $\overline{\text{DB}}$ 31 to ground. At the time of sensing, the potentials on data bus lines DB 30 and $\overline{\text{DB}}$ 31 are lower than $V_{CC_1}\text{-}V_{T_N}$ and closer to $V_{CC_2}\text{-}V_{T_N}$. Thus, this bleeder circuit is an improvement over the circuit of FIG. 1 when the source $V_{CC}$ is not constant. The bleeder of FIG. 2 has the characteristic that current flows only when the bus control circuitry asserts signal A 2, turning on bleeder transistors 15 and 16. However, while the potential of data bus lines DB 30 and $\overline{\text{DB}}$ 31 are closer to $V_{CC_2}\text{-}V_{T_N}$, the potentials typically do not reach $V_{CC_2}\text{-}V_{T_N}$. Time is required for the potential on data bus lines DB 30 and $\overline{\text{DB}}$ 31 to bleed off through transistors 15 and 16 and reach $V_{CC_2}\text{-}V_{T_N}$. Since this bleeder is operating regardless of $V_{CC}$ changes, it will bring the pre-charge level of data bus lines DB 30 and $\overline{\text{DB}}$ 31 down below $V_{CC}\text{-}V_{T_N}$ just before the activation of data bus sense amplifier DBSA 40. This is so even in the case where $V_{CC}$ is held constant. The bleeder 15, 16 dumps a constant amount of charge from DB 30 and $\overline{\text{DB}}$ 31 to ground, regardless of the previous $V_{CC}$ level. Hence the data bus line potential after equalization depends on the $V_{CC}$ level just before equalization. These unfixed pre-charge levels of data bus lines DB 30 and $\overline{DB}$ 31 result in potentially unacceptable sensitivity in the operation of data bus sense amplifier DBSA 40.

FIG. 5 is a timing chart illustrating the operation of the circuit of FIG. 2 in the presence of fluctuations in $V_{CC}$. In FIG. 5, $V_{CC}$ 500 and DBEQ 510 also begin at $V_{CC_1}$ and then fall to $V_{CC_2}$. The Y-select signal 520 goes high and DBEQ 510 falls shortly thereafter. As before, when $V_{CC}$ is $V_{CC_2}$, one of data bus signals DB 30 and $\overline{DB}$ 31 should reach $V_{02}$ in order for DBSA 40 to operate correctly. The assertion of signal A 540 causes signals 530 to fall to $V_{CC_2}$-$V_{T_N}$. This is correct operation for a falling $V_{CC}$. However, signal A 540 is always asserted, even when $V_{CC}$ rises and the signals 530 need to be at $V_{CC_1}$-$V_{T_N}$.

Another type of prior art pre-charging circuit uses substantially the same circuit of FIG. 2 but modifies the operation of the circuit by changing the timing of signal A 2. This third pre-charging circuit maintains signal A 2 at HIGH. Accordingly, data bus lines DB 30 and $\overline{DB}$ 31 are adjusted whenever there is a voltage drop on $V_{CC}$. The advantage here is that data bus lines DB 30 and $\overline{DB}$ 31 track the voltage $V_{CC}$. However, there is significant current consumption, as transistors 15 and 16 are, in essence, always on, and the pre-charge levels of data bus lines DB 30 and $\overline{DB}$ 31 are lowered, as with the circuits mentioned above. In order to limit the current consumption and the drop in the pre-charge levels of data bus lines DB 30 and $\overline{DB}$ 31, transistors 15 and 16 have a small size. The smaller transistor size, however, increases the time required to reach the desired $V_{CC_2}$-$V_{T_N}$ when $V_{CC}$ changes from $V_{CC_1}$ to $V_{CC_2}$.

Accordingly, there is a need for a pre-charging circuit which accurately tracks fluctuations in the power source with less power consumption. This and other goals of the invention will be readily apparent to one of ordinary skill in the art on the reading of the disclosure below.

SUMMARY OF THE INVENTION

Herein is disclosed a circuit for pre-charging a data line. The circuit tracks variation in $V_{CC}$ while minimizing power consumption.

In one embodiment, the invention is a circuit apparatus for pre-charging a data line. The present apparatus includes a power supply producing a varying voltage; a bleeder which bleeds charge from and infuses charge onto the data line and thereby maintains the data line at the varying voltage less a constant amount; and a control circuit which times the operation of the bleeder and the infuser. In preferred embodiments, an NMOS transistor is adapted to infuse the data line. A PMOS transistor is adapted to bleed the data line. The gate of the PMOS transistor is connected to a tracking circuit which biases the PMOS transistor on when the varying voltage falls. The transistors of the tracking circuit are all biased in sub-threshold conduction when the tracking circuit is ON, thereby minimizing power consumption. The tracking circuit consumes substantially zero power when the circuit is OFF.

DESCRIPTION OF THE PREFERRED EMBODIMENT

Figure 1:
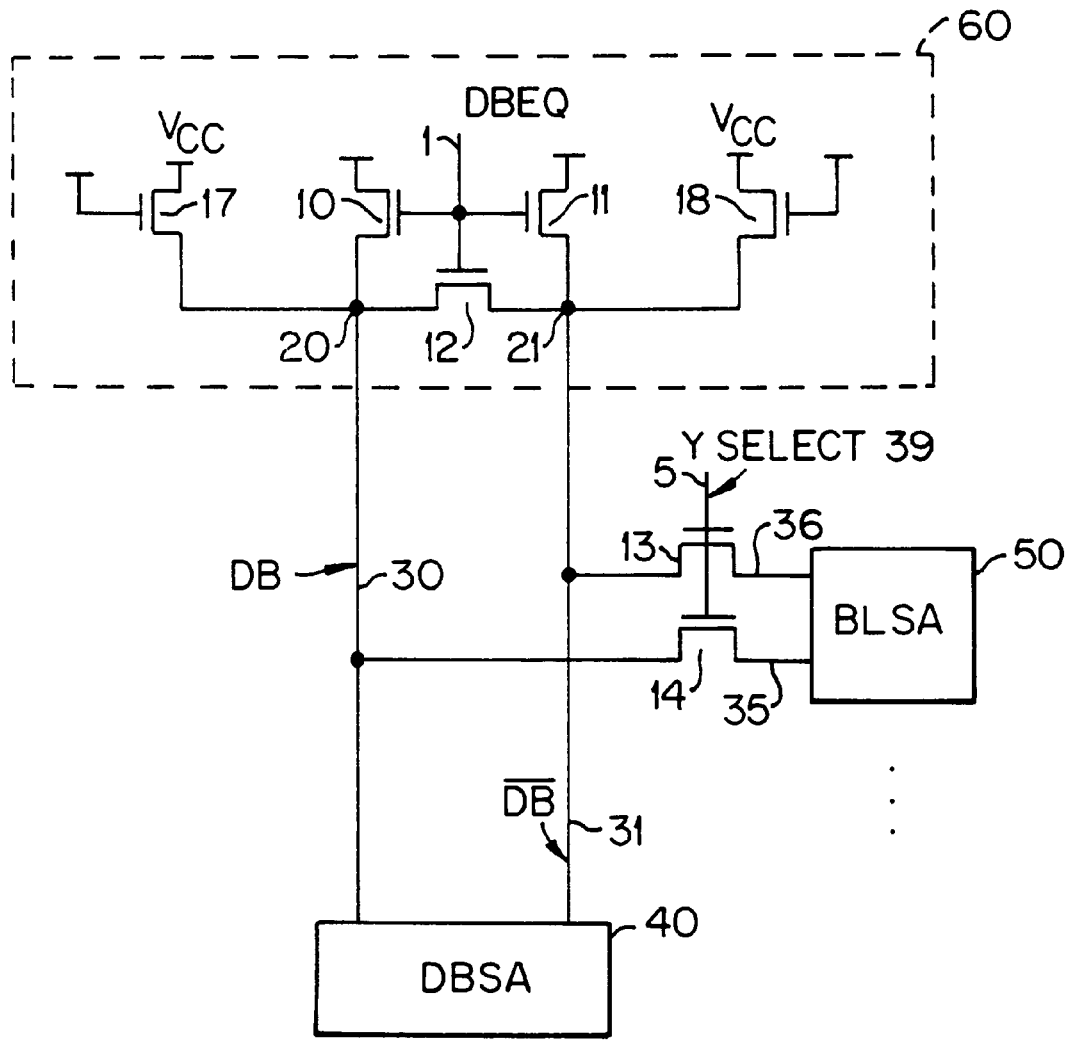
FIG. 1 is a simplified bus schematic including a pre-charging circuit of the prior art.
Figure 2:
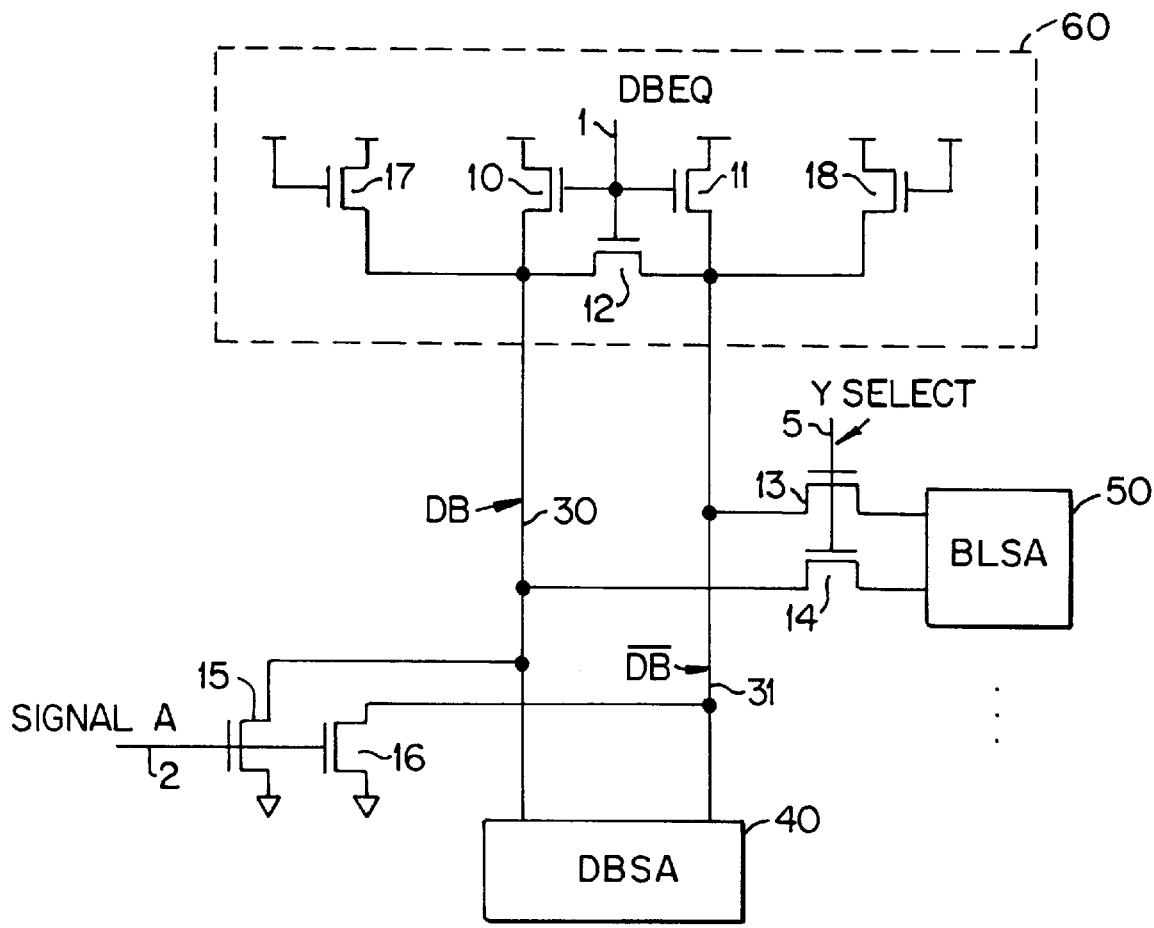
FIG. 2 is a schematic of a prior art pre-charging circuit including a bleeder.
Figure 3:
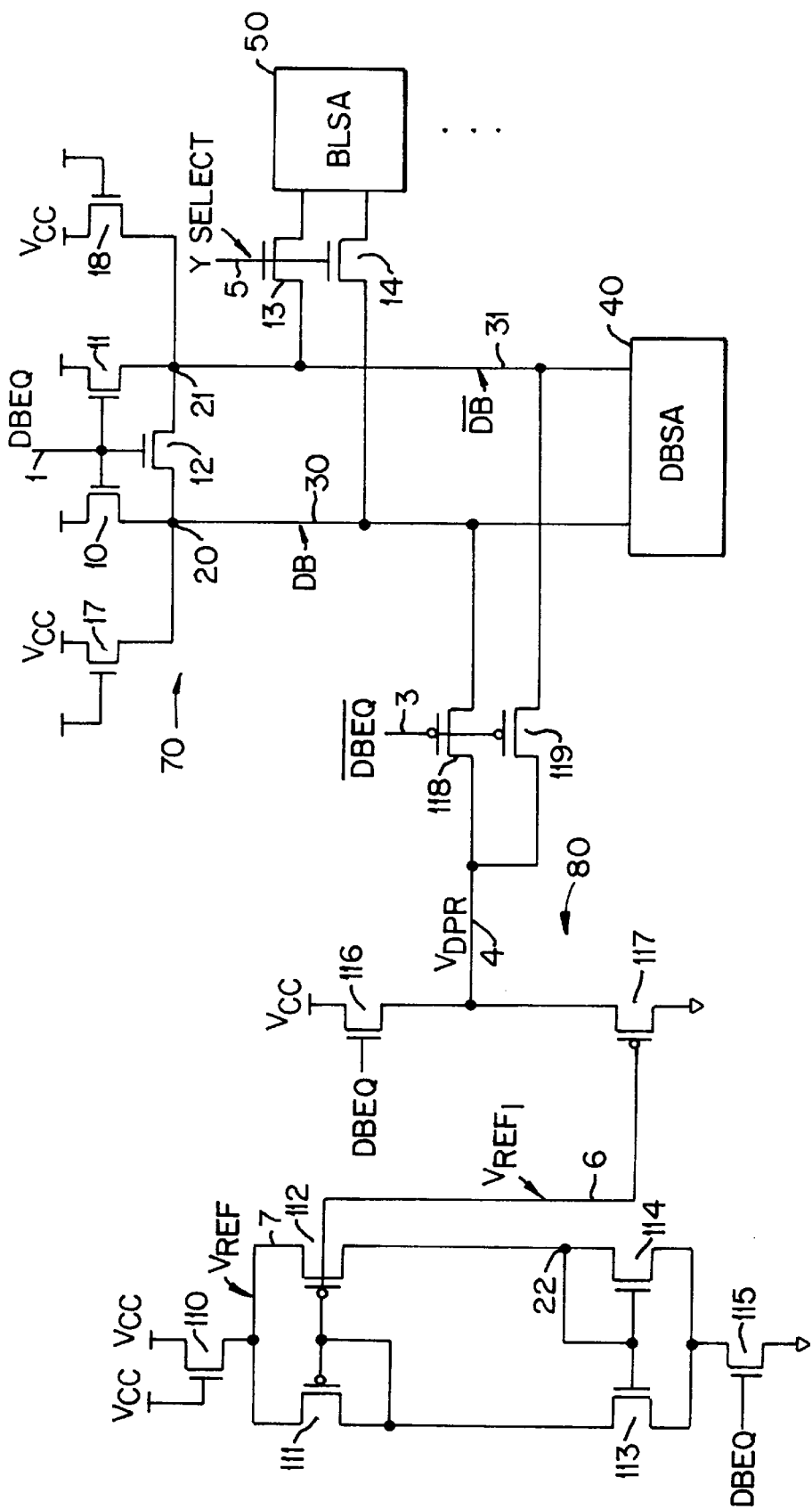
FIG. 3 is a bus schematic including an embodiment of the invention.
Figure 4:
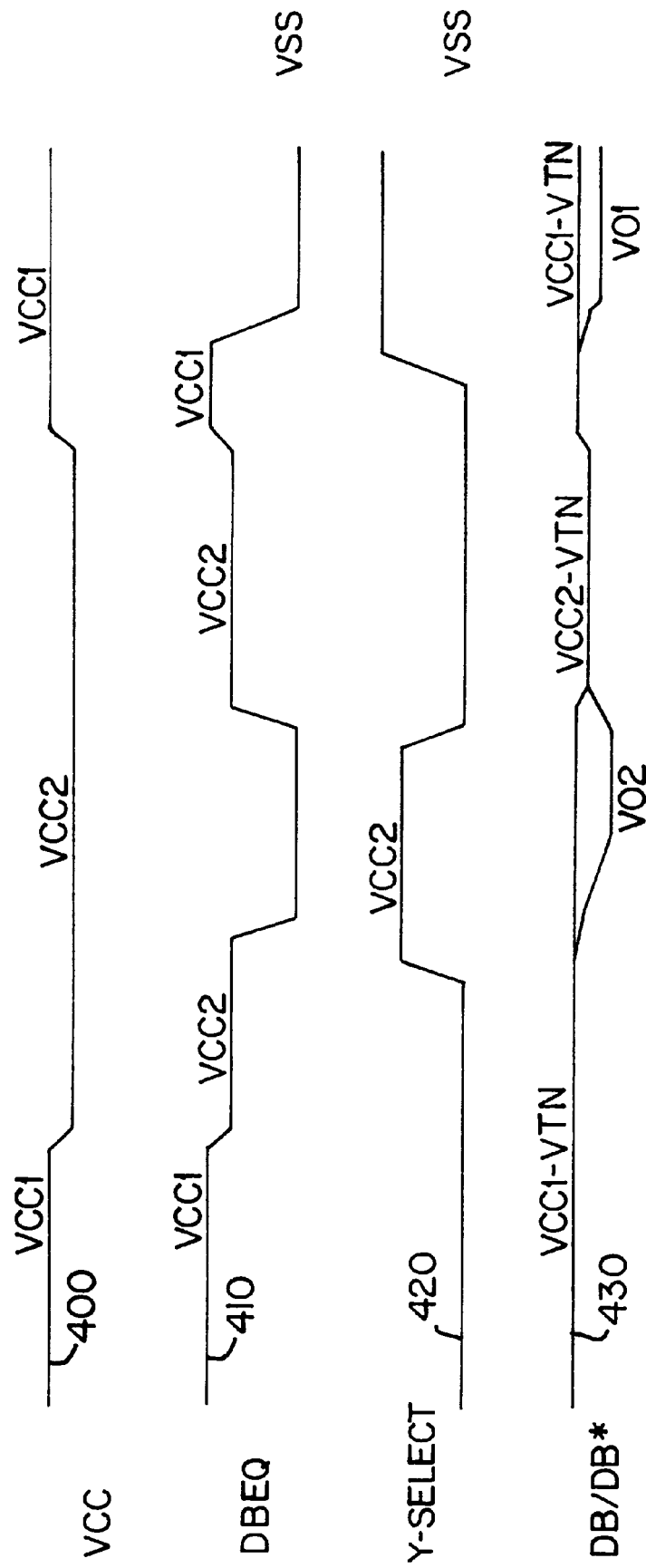
FIG. 4 is a timing chart for the circuit of FIG. 1.
Figure 5:
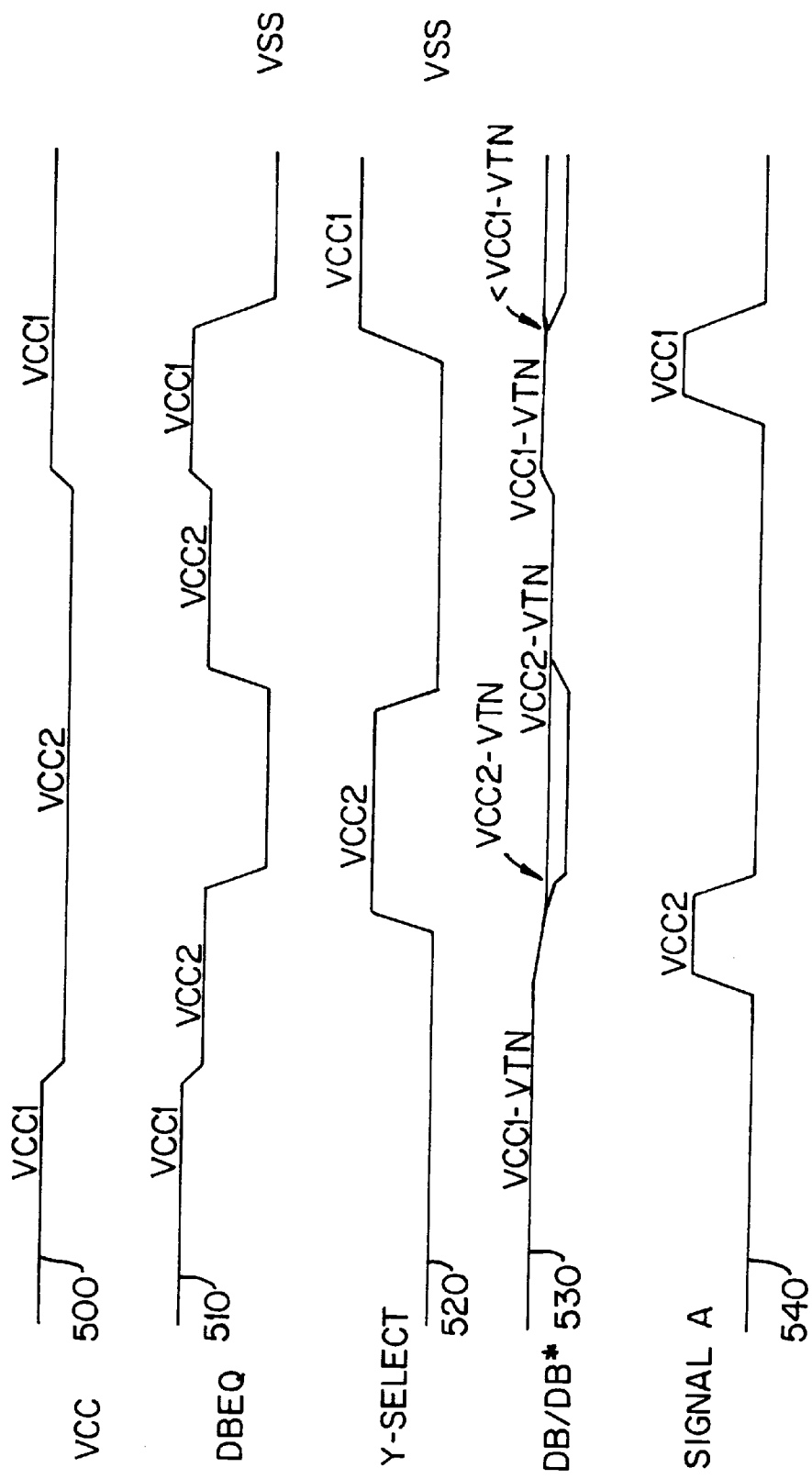
FIG. 5 is a timing chart for the circuit of FIG. 2.

FIG. 3 is a simplified bus schematic including an embodiment of the invention. FIG. 3 shows a circuit 70 including data bus lines DB 30 and $\overline{DB}$ 31. To node 20 on data bus line DB 30 is connected the drain of NMOS transistor 17. To node 21 on data bus line $\overline{DB}$ 31 is coupled the drain of NMOS transistor 18. The sources of transistors 17 and 18 are each coupled to $V_{CC}$. FIG. 3 also shows NMOS transistors 10, 11 and 12. The gate of each of transistors 10, 11 and 12 is coupled to signal DBEQ 1. The source of each of transistors 10 and 11 is coupled to $V_{CC}$. The drain of transistor 10 is coupled to the source of transistor 12 at node 20, while the drain of transistor 11 is coupled to the drain of transistor 12 at node 21. Both data bus lines DB 30 and $\overline{DB}$ 31 feed directly into data bus sense amplifier DBSA 40 and indirectly into BLSA 50 via NMOS transistors 14 and 13, respectively. The control inputs of transistors 13 and 14 are both coupled to Y-select line 5.

Circuit 70 also includes PMOS transistors 118 and 119, whose gates are tied to signal DBEQ 3, whose polarity is the reverse of signal DBEQ 1. The sources of transistors 118 and 119 are coupled to signal $V_{DPR}$ 4.

FIG. 3 also shows circuit 80 which includes NMOS transistor 110. The source and gate of transistor 110 are tied to $V_{CC}$, while the drain of transistor 110 is coupled to node $V_{REF}$ 7. Node $V_{REF}$ 7 ties the sources of PMOS transistors 111 and 112 together. The gate of transistor 111, the drain of transistor 111 and the gate of transistor 112 are coupled together as the signal $V_{REF_1}$ 6. Also tied to the drain of transistor 111 is the drain of NMOS transistor 113. The gates of transistor 113 and NMOS transistor 114 are tied to the drain of transistor 114 at node 22. The sources of transistors 113 and 114 are both coupled to the drain of NMOS transistor 115. The source of transistor 115 is coupled to ground. NMOS transistor 116 is tied in series with PMOS transistor 117. The source of transistor 116 is tied to $V_{CC}$, while the source of transistor 117 is tied to ground. The gate of transistor 117 is coupled to signal $V_{REF_1}$ 6. Signal $V_{DPR}$ 4 originates at the node where the drains of transistors 116 and 117 are coupled together. Signal $V_{DPR}$ 4, the data line pre-charging potential, is the output of circuit 80.

The operation of circuit 80 is described below. Circuit 80 is on when signal DBEQ 1 is asserted HIGH. Transistors 111 through 114 operate in sub-threshold conduction, and draw that conduction current from transistor 110. Therefore, transistor 110 is on whenever signal DBEQ 1 is asserted, regardless of the level of $V_{CC}$. (Of course, $V_{CC}$ must remain above $V_{T_N}$+$|V_{T_P}|$, when $V_{T_N}$ is smaller than $|V_{T_P}|$, or $2V_{T_N}$, when $V_{T_N}$ is larger than $|V_{T_P}|$.) Consequently, node $V_{REF}$ 7 tracks $V_{CC}$-$V_{T_N}$. Node $V_{REF_1}$ 6, at the drain of transistor 111, will equal $V_{REF}$ less $|V_{T_P}|$, the voltage drop across transistor 111. ($V_{T_P}$ is the threshold voltage of a P-channel transistor.) Signal $V_{REF_1}$ 6 will succeed in biasing on transistor 117. As a result, the potential of signal $V_{DPR}$ 4 will be equal to node $V_{REF}$ 7.

If $V_{CC}$ rises from $V_{CC_2}$ to $V_{CC_1}$, signal DBEQ 1 will also rise from $V_{CC_2}$ to $V_{CC_1}$, and the transistor 116 will be forward biased. Thus, transistor 116 will switch on to raise the data line pre-charging potential $V_{DPR}$ 4 from $V_{CC_2}$-$V_{T_N}$ to $V_{CC_1}$-$V_{T_N}$. If, on the other hand, $V_{CC}$ falls from $V_{CC_1}$ to $V_{CC_2}$, signal $V_{REF_1}$ 6 will correspondingly fall from ($V_{CC_1}$-

$V_{T_N}$-$|V_{T_P}|$) to ($V_{CC_2}$-$V_{T_N}$-$|V_{T_P}|$). Transistor 117 will then switch on and lower the data line pre-charging potential $V_{DPR}$ 4 from $V_{CC_1}$-$V_{T_N}$ to $V_{CC_2}$-$V_{T_N}$. When signal $V_{DPR}$ 4 again equals $V_{CC_2}$-$V_{T_N}$, only the very small sub-threshold leakage current flows through transistor 117. This leakage current is negligible.

Thus, transistor 116 will bring data bus lines DB and $\overline{DB}$ to $V_{CC}$-$V_{T_N}$ quickly when $V_{CC}$ rises from a lower to a higher voltage. Correspondingly, transistor 117 will bring data bus lines DB and $\overline{DB}$ to $V_{CC}$-$V_{T_N}$ quickly when $V_{CC}$ falls from a higher to a lower voltage. BLSA 50 will see proper line potentials even if $V_{CC}$ has risen or fallen from a previous potential.

Transistor 111 maintains node $V_{REF_1}$ 6 at $V_{REF}$-$|V_{T_P}|$. Nodes $V_{REF_1}$ 6 and $V_{REF}$ 7 together bias transistor 112 in sub-threshold conduction. Transistor 112 thus appears as a current source to transistor 114 and keeps node 22 at the threshold voltage of transistor 114. This voltage makes transistor 113 perform as a constant current source to transistor 111. As current sources, transistors 112 and 113 conduct only sub-threshold conduction currents under steady state conditions. (The current consumed by this circuit when DBEQ is LOW is zero.) The power consumption therefore is negligible.

Transistor 116 is on only when $V_{DPR}$ 4 is below $V_{CC}$-$V_{T_N}$, such as when $V_{CC}$ rises from $V_{CC_2}$ to $V_{CC_1}$. Correspondingly, transistor 117 is on only when $V_{DPR}$ 4 is larger than $V_{CC}$-$V_{T_N}$, such as when $V_{CC}$ falls from $V_{CC_1}$ to $V_{CC_2}$. When signal DBEQ 1 is asserted, transistors 118 and 119 pass current as necessary to equalize the potentials on data bus lines DB 30 and $\overline{DB}$ 31 and the data line pre-charging potential of $V_{DPR}$ 4.

If $V_{T_N}$ of transistor 116 is lower than that of transistor 110, then transistor 117 is out of its subthreshold conduction region and much more current than the subthreshold conduction current will flow from $V_{CC}$ to ground through transistors 116 and 117. Similarly, if $|V_{T_P}|$ of transistors 111 and 112 is larger than that of transistor 117, more current than sub-threshold conduction current will flow. Accordingly, the threshold voltage of n-channel transistors 110 and 116, and p-channel transistors 111, 112 and 117 are preferably closely matched, respectively. Alternatively, $V_{T_N}$ of transistor 110 is preferably slightly lower than that of transistor 116 to avoid this high leakage. Lower $|V_{T_P}|$ of transistor 111 and 112 will result in similar low leakage current. The threshold voltage of transistor 116 preferably matches that of transistors 10 and 11 so as to not disturb the data bus line pre-charge levels.

Circuit 80 is off when DBEQ is LOW. During this off period, the control circuitry selects a new data line sense amplifier BLSA (not shown) and the new information on data bus lines DB and DB will be sensed by DBSA 40.

Figure 6:
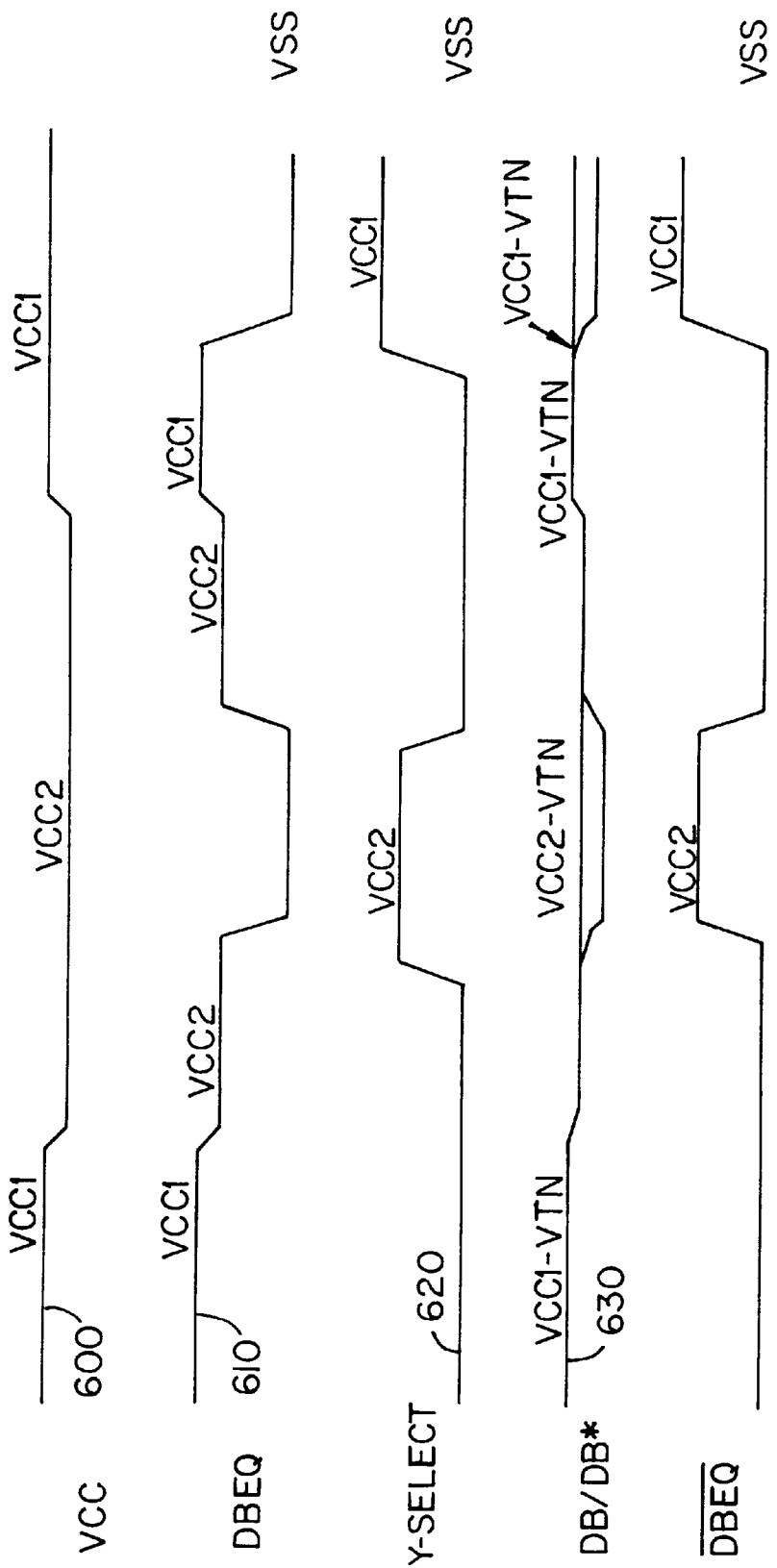
FIG. 6 is a timing chart for the circuit of FIG. 3.

FIG. 6 is a timing chart illustrating the operation of the circuit of the present invention in the presence of fluctuations in $V_{CC}$. In FIG. 6, $V_{CC}$ 600 and DBEQ 610 begin at $V_{CC_1}$, fall to $V_{CC_2}$ and later return to $V_{CC_1}$. The Y-select signal 620 goes high, and DBEQ 610 falls thereafter. It will be noted that, in a circuit embodying the present invention, signals 630 track both a rising and a falling $V_{CC}$ with minor-to-negligible attendant current consumption.

Accordingly, a pre-charging circuit which tracks a varying $V_{CC}$, particularly a $V_{CC}$ which falls from a first potential to a second, lower potential, has been disclosed. A pre-charging circuit which minimizes power consumption while tracking a varying $V_{CC}$ has also been disclosed. Variations on the elements disclosed herein will be obvious to persons of ordinary skill in the art. Therefore, this disclosure is not intended as limitation but as an example. For instance, the designation of the source and drain of a transistor is flexible; the device is symmetrical.

What is claimed is:

1. A circuit for pre-charging a data line, said circuit comprising:
    a power supply, producing as output a varying power voltage capable of moving between a first voltage and a second, lower voltage;
    a control circuit for generating an ON/OFF signal, said ON/OFF signal adapted to be in one of an ON state and an OFF state; and
    a bleeder, receiving as input said varying power voltage and said ON/OFF signal, said bleeder coupled to said data line and adapted to pull said data line up and down in order to maintain said data line at said varying power voltage less a constant amount when said ON/OFF signal is in said ON state said bleeder consuming substantially zero power when said ON/OFF signal is in said OFF state.

2. A circuit for pre-charging a data line, said circuit comprising:
    a power supply, producing as output a varying power voltage capable of moving between a first voltage and a second, lower voltage;
    a control circuit for generating an ON/OFF signal, said ON/OFF signal adapted to be in one of an ON state and an OFF state; and
    a bleeder circuit, receiving as input said varying power voltage and said ON/OFF signal, said bleeder coupled to said data line and adapted to pull down said data line to said varying power voltage less a constant amount when said varying power voltage falls and said ON/OFF signal is in said ON state; and
    an infusion circuit, receiving as input said varying power voltage and said ON/OFF signal, said infusion circuit coupled to said data line and adapted to pull up the voltage on said data line to said varying power voltage less a constant amount when said varying power voltage rises and said ON/OFF signal is in said ON state.

3. The circuit of claim 2 wherein said bleeder circuit comprises a PMOS transistor and said infusion circuit comprises an NMOS transistor.

4. The circuit of claim 3 wherein said NMOS transistor has a gate, a first terminal and a second terminal, said gate coupled to said ON/OFF signal, said first terminal coupled to said power supply and said second terminal coupled to said data line.

5. The circuit of claim 3 wherein said PMOS transistor has a gate, a first terminal and a second terminal, said first terminal coupled to said data line, said second terminal coupled to ground, said gate coupled to a tracking circuit providing a reference voltage equal to said varying power voltage less $V_{T_N}$ less $|V_{T_P}|$ $V_{TN}$ is the threshold voltage of an N-channel transistor and $V_{TP}$ is the threshold voltage of a P-channel transistor.

6. The circuit of claim 5 wherein said tracking circuit comprises six ordered transistors, each of said six ordered transistors having a source, a drain and a control input, wherein
    said source and control input of said first transistor are coupled to said power supply;
    said source of said second transistor coupled to said drain of said first transistor, said drain of said second transistor coupled to said control input of said second transistor, said drain providing said reference voltage;

said source of said third transistor coupled to said drain of said first transistor, said control input of said third transistor coupled to said control input of said second transistor;

said drain of said fourth transistor coupled to said drain of said second transistor; said control input of said fourth transistor coupled to said drain of said third transistor;

said drain and control input of said fifth transistor coupled to said control input of said fourth transistor;

said drain of said sixth transistor coupled to said sources of said fourth and fifth transistors; said source of said sixth transistor coupled to ground.

7. The circuit of claim 1 further comprising an isolation switch, said isolation switch coupled to said bleeder circuit and to said data line, said isolation switch electrically separating said data line from said bleeder when said ON/OFF signal is in said OFF state.

8. The circuit of claim 7 wherein said isolation switch is a transistor having a gate, a first terminal and a second terminal, said gate coupled to said ON/OFF signal, said first terminal coupled to said data line and said second terminal coupled to said bleeder.

9. In a random access memory, a circuit for pre-charging a data line, said circuit comprising:

a power supply, producing as output a varying power voltage capable of moving between a first voltage and a second, lower voltage;

a control circuit for generating an ON/OFF signal, said ON/OFF signal adapted to be in one of an ON state and an OFF state; and a bleeder, receiving as input said varying power voltage and said ON/OFF signal, said bleeder coupled to said data line and adapted to pull said data line up and down in order to maintain said data line at said varying power voltage less a constant amount when said ON/OFF signal is in said ON state, said bleeder consuming substantially zero power when said ON/OFF signal is in said OFF state.

10. The circuit of claim 9 wherein said random access memory is dynamic.

11. The circuit of claim 10 wherein said dynamic random access memory is a 1 megabit-by-8-bit DRAM.

12. In a random access memory, a circuit for pre-charging a data line, said circuit comprising:

a power supply, producing as output a varying power voltage capable of moving between a first voltage and a second, lower voltage;

a control circuit for generating an ON/OFF signal, said ON/OFF signal adapted to be in one of an ON state and an OFF state; and a bleeder circuit, receiving as input said varying power voltage and said ON/OFF signal, said bleeder coupled to said data line and adapted to pull down said data line to said varying power voltage less a constant amount when said varying power voltage falls and said ON/OFF signal is in said ON state; and an infusion circuit, receiving as input said varying power voltage and said ON/OFF signal, said infusion circuit coupled to said data line and adapted to pull up the voltage on said data line to said varying power voltage less a constant amount when said varying power voltage rises and said ON/OFF signal is in said ON state.

13. The circuit of claim 12 wherein said random access memory is dynamic.

14. The circuit of claim 13 wherein said dynamic random access memory is a 1 megabit-by-8-bit DRAM.

* * * * *